United States Patent [19]

Mohd

[11] Patent Number: 5,933,021
[45] Date of Patent: Aug. 3, 1999

[54] NOISE SUPPRESSION METHOD AND CIRCUITS FOR SENSITIVE CIRCUITS

[75] Inventor: Bassam J. Mohd, Sunnyvale, Calif.

[73] Assignee: Sun Microsystems, Inc, Palo Alto, Calif.

[21] Appl. No.: 08/665,782

[22] Filed: Jun. 18, 1996

[51] Int. Cl.$^6$ .................................................. H03K 17/16
[52] U.S. Cl. .................................. 326/30; 326/34; 326/24
[58] Field of Search ................................ 326/30, 21, 22, 326/23, 24, 31, 34

[56] References Cited

U.S. PATENT DOCUMENTS

| | | | |
|---|---|---|---|
| 3,946,251 | 3/1976 | Kawagoe . | |
| 4,498,021 | 2/1985 | Uya | 326/30 |
| 5,027,008 | 6/1991 | Runaldue | 326/30 |
| 5,166,561 | 11/1992 | Okura | 326/30 |
| 5,218,242 | 6/1993 | Imazu et al. | 326/30 |

*Primary Examiner*—Michael Tokar
*Assistant Examiner*—Richard Roseen
*Attorney, Agent, or Firm*—The Gunnison Law Firm

[57] ABSTRACT

Circuits and methods of suppressing noise on a signal line are disclosed. A noise suppression pull-down circuit is coupled to a signal line which couples the output element of a first logic element to the input terminal of a second logic element. When the first logic element drives a logic low onto the signal line, the noise suppression pull-down circuit is activated to provide a weak pull-down on the signal line. When the first logic element drives a logic high onto the signal line, the noise suppression pull-down circuit is deactivated to prevent interference with the first logic element.

14 Claims, 4 Drawing Sheets

NOISE SUPPRESSION METHOD AND CIRCUITS FOR SENSITIVE CIRCUITS

BACKGROUND OF THE INVENTION

1. Field of the Invention

The present invention relates to noise reduction for integrated circuits (ICs), and more particularly to reducing the noise on the input line of a driver.

2. Description of Related Art

Digital logic circuits have increased in speed and complexity by using lower voltages and smaller logic elements. As the voltage of logic elements has decreased, the noise margins of logic elements have also decreased. Furthermore, fast logic circuit designs, such as domino circuits, have an increased noise susceptibility. Therefore, the faster logic elements have become more susceptible to erroneous activation or deactivation due to noise on the signal lines driving the logic elements.

FIG. 1 shows a typical circuit with output terminal 111 of first logic element 110 driving signal line 120 to input terminal 132 of second logic element 130. The logic elements and signal lines can be on a printed circuit board or a semiconductor chip. Furthermore, the logic elements can be for example drivers, inverters, AND gates, OR gates, NAND gates, NOR gates, flip-flops, latches, microprocessors, or memories.

A primary cause of noise on signal line 120 is crosstalk noise from adjacent signal lines. As shown in FIG. 2, signal line 120 develops a crosstalk capacitance Cx, represented by capacitor 240 and capacitor 250, with signal line 210 and signal line 230. Due to crosstalk capacitance Cx, when signal lines 210 or signal line 230 switches states some crosstalk noise is introduced onto signal line 120. The crosstalk noise on signal line 120 can cause erroneous activation or deactivation of second logic element 130 (FIG. 1).

Typically, crosstalk noise has been minimized using routing techniques. For example, as shown in FIG. 3(a), signal line 210, signal line 120, and signal line 230 can be routed further apart to minimize the crosstalk capacitance. For even greater crosstalk suppression, ground or power lines, such as ground line 315 or power line 325, can be routed between signal lines 210, signal line 120, and signal line 230, as shown in FIG. 3(b). Since the ground lines and power lines do not switch states in normal operation, the power lines and ground lines do not produce any crosstalk noise. Furthermore, ground line 315 and power line 325 shield signal line 120 from noise on signal line 210 and signal line 230.

Although routing techniques can substantially reduce crosstalk problems, typically, the routing techniques greatly increases the board area or semiconductor chip area required for the signal lines. The increase in board area or chip area increases the cost of a digital system or chip. In addition, the size of many logic blocks in VLSI circuits are dictated by the area of the signal lines rather than the area of transistors. Therefore, routing techniques which would further increase the area of the signal lines are very costly and not recommended in these logic blocks. Furthermore, these routing techniques do not provide noise suppression for other types of noise such as ground bounce (as described below).

FIG. 4 shows an example transistor level diagram of first logic element 110, signal line 120, and second logic element 130. In the example of FIG. 4, first logic element 110 is a static inverter 110-4 formed by PMOS transistor 403 and NMOS transistor 406. Second logic element 130 is a CMOS domino driver 130-4. Voltage supply 410 represents the ground bounce voltage Vgroundbounce, i.e. the difference between the actual voltage level of ground at first logic element 110 and second logic element 130.

CMOS domino driver 130-4 is selected in this example since the CMOS domino logic family is extremely sensitive to noise on the incoming signal line. CMOS domino logic elements are clocked elements requiring a precharge interval and an evaluation interval. During the precharge interval, when clock signal CLK is at a logic low level, the output node of the CMOS domino logic element is charged to a logic high level. During the evaluation interval, when clock signal CLK is at a logic high level, the output node is either discharged to reach logic low or remains at logic high depending on the inputs to the CMOS domino logic element.

Specifically, in CMOS domino driver 130-4, during the precharge interval, when clock signal CLK is at logic low, PMOS transistor 413 precharges output node 416 to a logic high level. During the evaluation interval, if input signal IN on signal line 120 is at logic high, the charge on output node 416 can be discharged to ground through input NMOS transistor 419 and clocked NMOS transistor 422, so that output node 416 transitions to logic low. However, if input signal IN on signal line 120 is at logic low, the charge on output node 416 is not discharged, so that output node 416 remains at logic high. Output inverter 420 provides output signal OUT by inverting the signal on output node 416.

The particular embodiment of CMOS domino driver 130-4 shown in FIG. 4, includes an optional feedback latch formed by feedback inverter 430, feedback PMOS transistor 440, and feedback NMOS transistor 450. During the precharge interval output node 416 is at logic high; therefore feedback PMOS transistor 440 is activated and maintains output node 416 at logic high. Input NMOS transistor 419 and clocked NMOS transistor 422 have a greater current sinking strength than the current sourcing strength of feedback PMOS transistor 440 so that input NMOS transistor 419 and clocked NMOS transistor 422 are able to discharge output node 416. During the evaluation interval, if input signal IN on signal line 120 is at logic high, output node 416 is forced to logic low by input NMOS transistor 419 and clocked NMOS transistor 422. Feedback PMOS transistor 440 is deactivated when output node 416 goes to logic low. Feedback PMOS transistor 440 is sized so that feedback PMOS transistor 440 can balance the effect of leakage through input NMOS transistor 419 and clocked NMOS transistor 422 without unduly slowing the discharge of output node 416.

CMOS domino driver 130-4 is particularly susceptible to noise, that causes input signal IN on signal line 120 to have a higher voltage than ground when input signal IN should be at logic low. For example if signal line 210 (FIG. 2) were to transition for logic low to logic high, while signal line 120 is at logic low, a momentary spike may appear on signal line 120 due to the effect of the crosstalk capacitance Cx. Even a momentary spike of sufficient voltage on signal line 120 during the evaluation interval can partially activate input NMOS transistor 419 resulting in the discharge of output node 416. Even though NMOS transistor 419 is deactivated after the spike output node 416 is not recharged until the next precharge interval; therefore, CMOS domino driver 130-4 incorrectly outputs a logic high instead of a logic low during the current evaluation interval.

Furthermore, the ground bounce problem represented by voltage supply 410 compounds the noise problem. If the ground voltage at logic static inverter 110-4 is at a positive ground bounce voltage Vgroundbounce above voltage of the ground signal at CMOS domino driver 130-4 and static inverter 110-4 is attempting to drive input signal IN to a logic low level then input signal IN is only driven to the ground bounce voltage Vgroundbounce instead of the ground level as expected by CMOS domino driver 130-4. Therefore, even a very low voltage noise spike signal line 120 can partially activate input NMOS transistor 419.

As mentioned above routing techniques have been used to reduce the noise problem. However routing techniques are too expensive in terms of board area or semiconductor die area. Furthermore, the routing techniques have no effect on the ground bounce problem. Therefore, some circuit techniques have been developed to attempt to suppress noise on a signal line.

The most common technique is to increase the current sourcing strength and current sinking strength of the driver. For the circuit of FIG. 4, the current sinking strength of NMOS transistor 406 on signal line 120 is increased using well known techniques. Thus as a noise spike is developed on signal line 120, NMOS transistor 406 is able to sink the noise to ground. However, if signal line 120 is long, the inherent resistance of signal line 120 increases. As the resistance of signal line 120 increases, the time required for NMOS transistor 406 to sink the noise on signal line 120 also increases. Therefore, if signal line 120 is long increasing the current sinking strength of NMOS transistor 406 does not prevent the partial activation of input NMOS transistor 419 due to noise spikes. Moreover, increasing the current sinking strength of NMOS transistor 406 entails increasing the load to the driver of NMOS transistor 406 which would increase the switching time of static inverter 110-4. Furthermore, increasing the current sinking strength of NMOS transistor 406 has no effect on the ground bounce problem, since signal line 120 is only pulled to the ground bounce voltage Vgroundbounce.

Another circuit technique to reduce the impact noise spikes on signal line 120 is to increase the current sourcing strength of feedback PMOS transistor 440. As explained above, feedback PMOS transistor 440 is present to offset leakage current through input NMOS transistor 419 and clocked NMOS transistor 422. By increasing the current sourcing strength of feedback PMOS transistor 440, feedback PMOS transistor 440 is able to offset the partial activation of input NMOS transistor 419 due to noise spikes on signal line 120. However, the increasing the current sourcing strength of feedback PMOS transistor 440 enough to offset noise spikes significantly slows the discharge of output node 416 under normal operation. Moreover, increasing the current sourcing strength of feedback PMOS transistor 440 increases the short circuit current, which increases power consumption, during the evaluation interval if input NMOS transistor 419 and clocked NMOS transistor 422 are activated. Furthermore, increasing the current sourcing strength of feedback PMOS transistor 440 has no effect on the ground bounce problem.

Hence, there is a need for a method or a circuit to suppress noise on a signal line between logic elements. Specifically, the method or circuit must be able to alleviate ground bounce and cross talk noise without significantly slowing the switching time of the logic elements or consuming excessive amounts of board or die area.

SUMMARY

In accordance with the present invention methods and circuits are disclosed for suppressing noise on a signal line.

By incorporating the noise suppression pull-down circuit of the present invention with signal lines, noise on the signal lines can be suppressed with less speed degradation and area consumption than prior art methods and circuits. Furthermore, the noise suppression pull-down circuit reduces the ground bounce problem caused by differing voltage of ground signals in different areas of a circuit.

In a circuit having the output terminal of a first logic element coupled to the input terminal of a second logic element by a signal line, noise on the signal line can cause erroneous activation or deactivation of all or part of the second logic element. The noise on the signal line can be suppressed in accordance to one embodiment of the invention by coupling a noise suppression pull-down circuit which provides a weak pull-down on the signal line. The noise suppression pull-down circuit is activated when the first logic element drives a logic low onto the signal line and deactivated when the first logic element drives a logic high onto the signal line. In one embodiment of the invention the noise suppression pull-down circuit is made by coupling the input terminal of an inverter to the signal line, the output terminal of the inverter to the control terminal of a transistor, a first power terminal of the transistor to the signal line, and a second power terminal of the transistor to ground. In a second embodiment of the invention, the transistor is a NMOS transistor, such that the control terminal is the gate terminal of the NMOS transistor, the first power terminal is the drain terminal of the NMOS transistor, and the second power terminal is the source terminal of the NMOS transistor.

Another advantage of the noise suppression pull-down circuit is obtained by placing the noise suppression pull-down circuit in the vicinity of the second logic element so that the voltage of a ground signal to the noise suppression pull-down circuit is only negligibly different than the voltage of a ground signal to the second logic element. As used herein, a first circuit or logic element is in the vicinity of a second circuit or logic element only if the voltage of the ground signal to the first circuit or logic element is not materially different from the voltage of the ground signal to the second circuit or logic element. Thus any ground bounce between the output of the first circuit or logic element and the input of the second circuit or logic element is reduced, since the voltage of a logic low output of the first circuit or logic element is at the same voltage of the ground signal to the second circuit or logic element. Since the noise suppression pull-down circuit weakly drives the signal line to logic low, the signal line is driven to the ground level of the noise suppression pull-down circuit. Thus, when the noise suppression pull-down circuit is in the vicinity of the second logic element, the noise suppression pull-down circuit reduces any ground bounce that may exist between the first logic element and the second logic element.

BRIEF DESCRIPTION OF THE DRAWINGS

FIG. 3(*b*) is a second prior art routing technique to minimize cross talk between parallel signal lines.

DETAILED DESCRIPTION

According to the principles of this invention, a unique noise suppression pull-down circuit suppresses noise on a signal line coupled between two logic elements without requiring as much area as prior art routing techniques and without suffering as much speed degradation as prior circuit techniques. Furthermore the noise suppression pull-down circuit reduces the ground bounce occurring on the logic elements. The present invention provides a path to sink noise on the signal line while only minimally impacting the speed of the circuits.

As used herein, a weak pull-down drives a low current, high impedance logic low onto a line. Due to the low current and high impedance, another element is still able to drive the line, that is connected to the weak pull-down, to a logic high.

Figure 1:
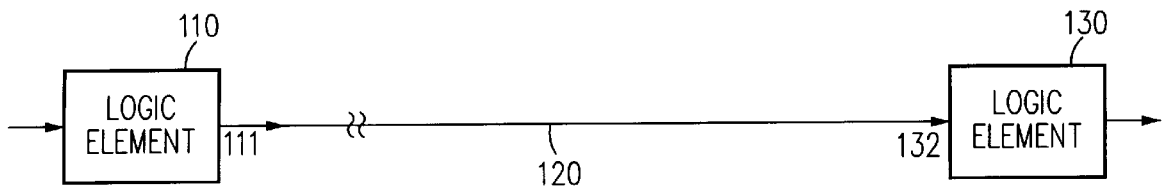
FIG. 1 shows a well known and frequently used circuit of a signal line coupling two logic elements which is susceptible to noise problems.
Figure 2:
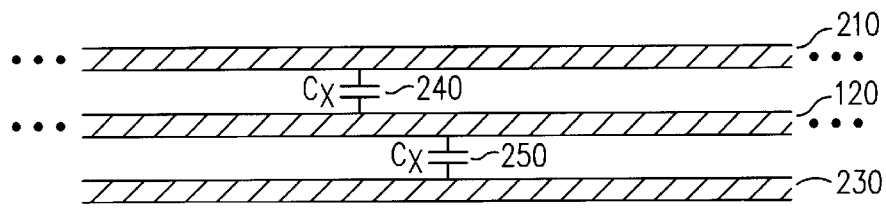
FIG. 2 shows a the cross talk capacitance between parallel signal lines.
Figure 3A:
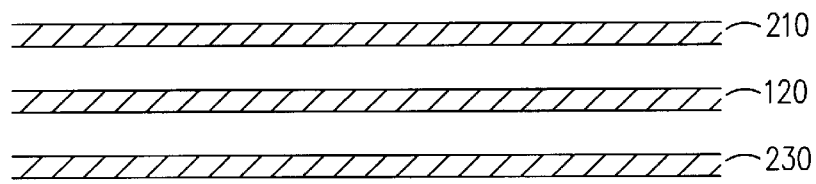
FIG. 3(*a*) is a first prior art routing technique to minimize cross talk between parallel signal lines.
Figure 3B:
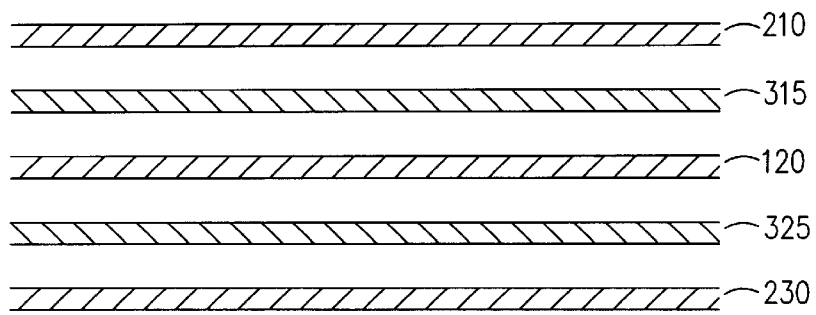
Figure 4:
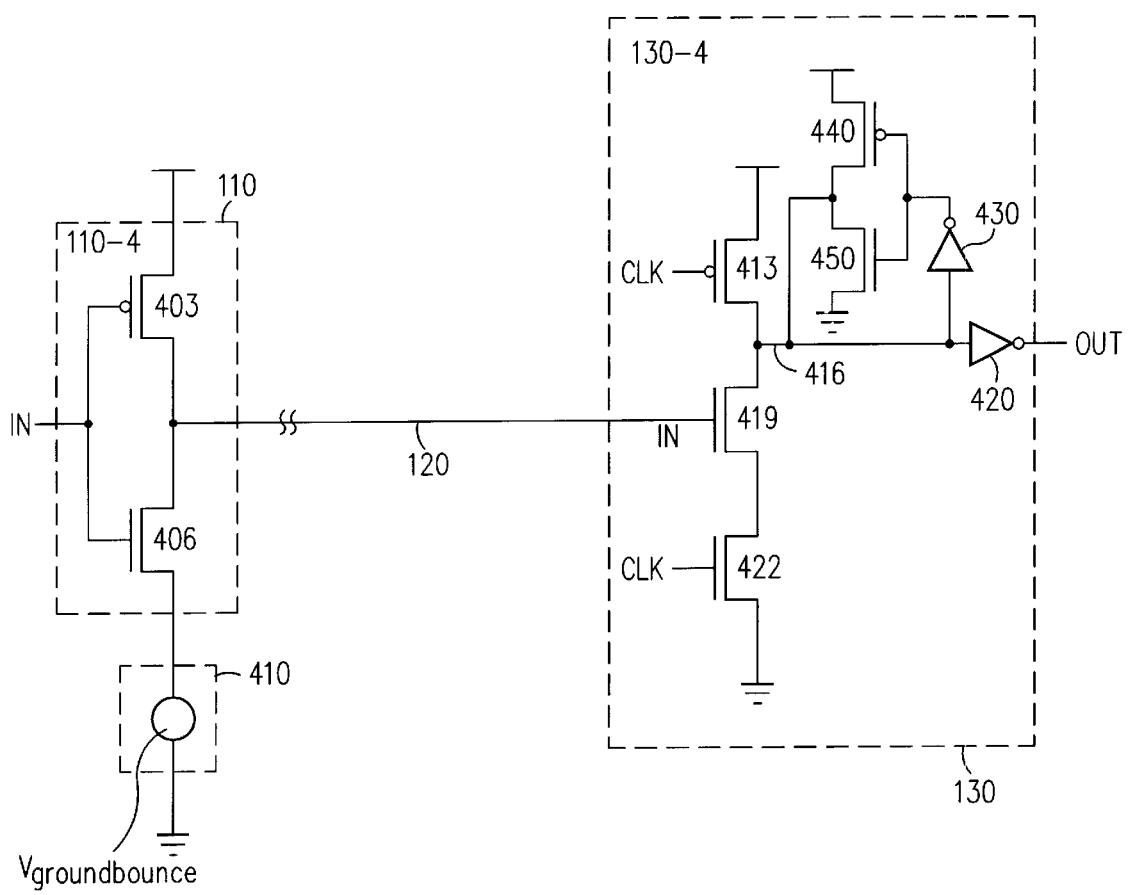
FIG. 4 shows a transistor level diagram of a static inverter coupled to a CMOS domino driver by a signal line.
Figure 5:
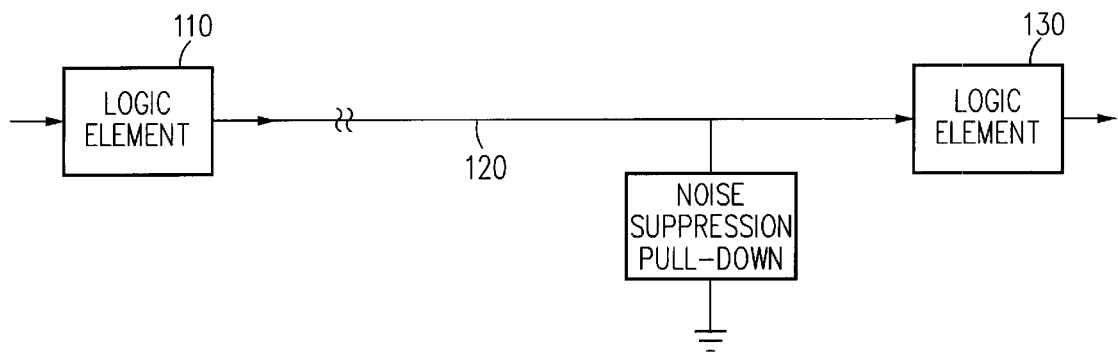
FIG. 5 shows a circuit comprising two logic elements coupled by a signal line, which is coupled to one embodiment of the present invention to suppress noise on the signal line.

FIG. 5 shows noise suppression pull-down circuit 510 coupled between signal line 120 and ground. As explained above with respect to FIG. 1, signal line 120 could be for example a wire on a printed circuit board or an interconnect on a semiconductor die. Furthermore, first logic element 110 and second logic element 130 could be on a single semiconductor die or on separate dies. Noise suppression pull-down circuit 510 provides a weak pull-down on signal line 120 if signal line 120 is at a logic low state. Therefore, noise suppression pull-down circuit 510 is able to sink noise on signal line 120 so that logic element 130 is not erroneously activated or deactivated. If signal line 120 is at a logic high state, noise suppression pull-down circuit 510 does not actively effect signal line 120. However, noise suppression pull-down circuit 510 does increase the load on signal line 120. The increased load provides some noise suppression and causes a slight decrease on the switching time of signal line 120. Since noise suppression pull-down circuit 510 provides a weak pull-down, first logic element 110 can overpower noise suppression pull-down circuit 510 and force signal line 120 to a logic high. Noise suppression pull-down circuit 510 also reduces any ground bounce problems since, noise suppression pull-down circuit 510 is placed in the vicinity of logic element 130, i.e. where the voltage of the ground signal to noise suppression pull-down circuit 510 differs very little from the voltage of the ground signal to logic element 130, and pulls a logic low on signal line 120 to the ground level of logic element 130.

Figure 6:
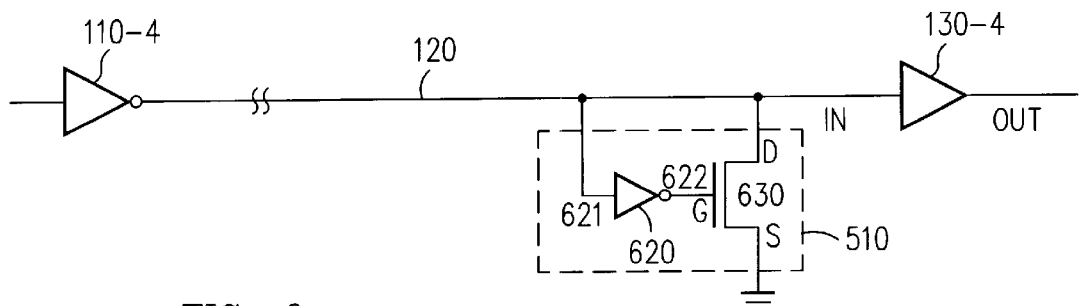
FIG. 6 shows a circuit comprising two logic elements coupled by a signal line, which is also coupled to one embodiment of the present invention to suppress noise on the signal line.

FIG. 6 shows one embodiment of noise suppression pull-down circuit 510 in the example circuit of static inverter 110-4 and CMOS domino driver 130-4. In the embodiment of FIG. 6, noise suppression pull-down circuit 510 comprises inverter 620 and noise suppression transistor 630. Specifically, input terminal 621 of inverter 620 is coupled to signal line 120. Output terminal 622 of inverter 620 is coupled to gate terminal G of noise suppression transistor 630. Drain terminal D of noise suppression transistor 630 is coupled to signal line 120. Source terminal S of noise suppression transistor 630 is coupled to ground. Noise suppression transistor 630 should only provide a weak pull-down; otherwise static inverter 110-4 is not able to pull signal line 120 to a logic high state.

Figure 7:
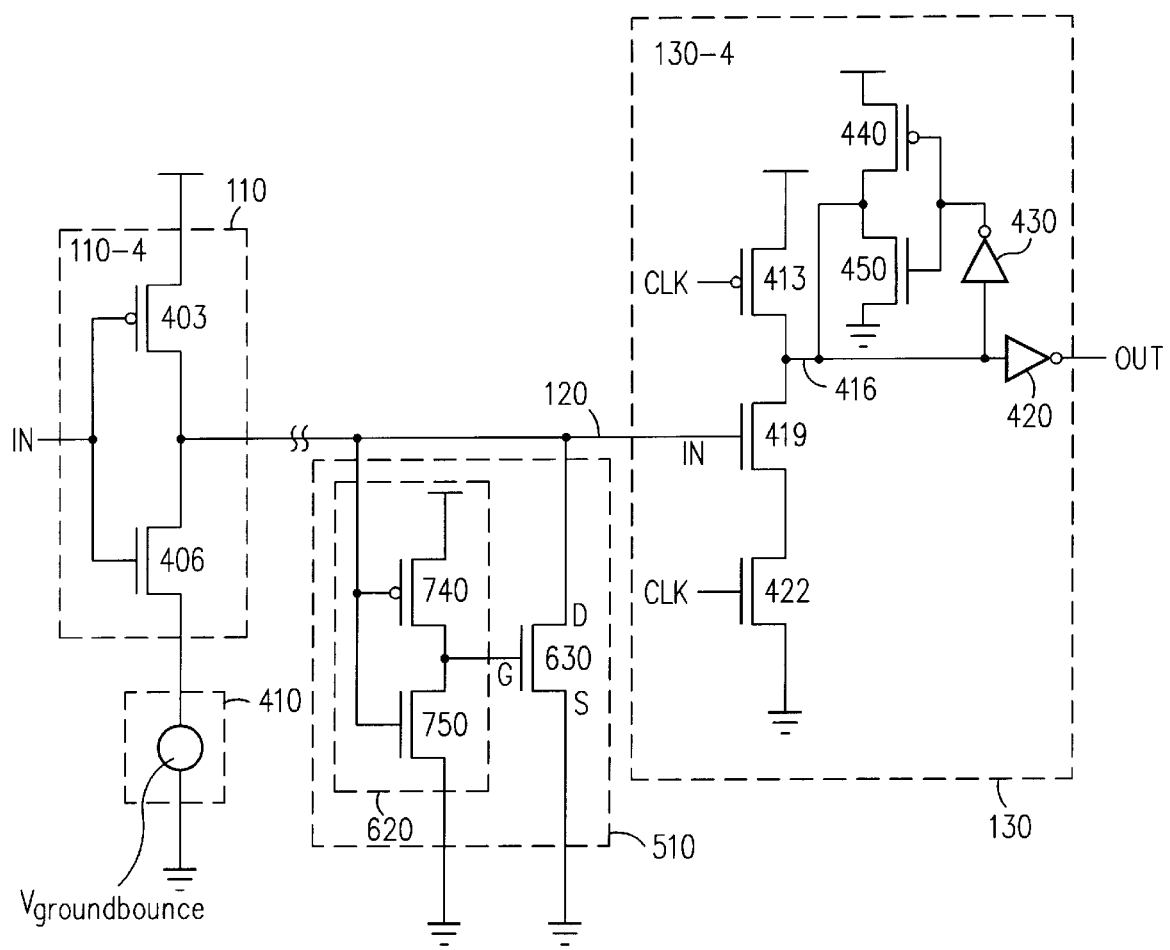
FIG. 7 shows a transistor level circuit of a static inverter coupled to a CMOS domino driver by a signal line, which is also coupled to one embodiment of the present invention to suppress noise on the signal line.

FIG. 7 shows a transistor level diagram of FIG. 6. Since the transistor level diagrams of static inverter 110-4 and CMOS domino driver 130-4 are described above, the descriptions are not repeated. As shown in FIG. 7, inverter 620 can be formed with PMOS transistor 740 and NMOS transistor 750.

As with most noise suppression circuits, noise suppression pull-down circuit 510 causes some degradation in speed proportional to the amount of noise suppression. However, the amount of speed degradation for a given amount of noise suppression for noise suppression pull-down circuit 510 is less than the prior art techniques described above. The amount of noise suppression and therefore speed degradation can be adjusted in the embodiment of noise suppression pull-down circuit 510 in FIG. 7, by sizing the various transistors. Specifically, PMOS transistor 740, NMOS transistor 750, noise suppression transistor 630 are sized relative to each other as well as to the transistors of logic element 110, which drive signal line 120, and the input transistors of logic element 130 to adjust the current sourcing strength and current sinking strength of the transistors. In FIG. 7, NMOS transistor 406 and PMOS transistor 403 drive signal line 120, while input NMOS transistor 419 receives input signal IN on signal line 120.

As is well known in the art, the current sourcing strength of PMOS transistors and the current sinking strength of NMOS transistors are dependent upon a width (W) of the channel and a length (L) of the channel. The current sourcing strength and current sinking strength increases with an increase in the width of the channel. Conversely, the current sourcing strength and current sinking strength of a transistor decreases with an increase to the length of the channel. Therefore, the current sourcing strength and current sinking strength is proportional to the W/L ratio of the channel of the transistor, sometimes called the W/L ratio of the transistor.

To increase noise suppression on signal line 120 in FIG. 7, the current sinking strength of noise suppression transistor 630 is increased by increasing the W/L ratio of the channel of noise suppression transistor 630, sometimes called the W/L ratio of noise suppression transistor 630. However, increasing the current sinking strength of noise suppression transistor 630 slows the transition on signal line 120 from logic low to logic high when PMOS transistor 403 is activated. The optimal size of noise suppression transistor 630 depends on the timing constraints on signal line 120. Ideally, the W/L ratio of noise suppression transistor 630 is chosen to give maximum noise suppression without violating the timing constraints on signal line 120. Typically, the W/L ratio of noise suppression transistor 630 is about 0.02 to about 0.05 times the W/L ratio of the channel of PMOS transistor 403, also sometimes called the W/L ratio of PMOS transistor 403.

The speed degradation of noise suppression transistor 630 is lessened by the deactivation of noise suppression transistor 630 by inverter 620. Further lessening of the speed degradation of noise suppression transistor 630 can be obtained by sizing PMOS transistor 740 and NMOS transistor 750 to deactivate noise suppression transistor 630 more rapidly.

Specifically, the current sinking strength of NMOS transistor 750 relative to the current sourcing strength of PMOS transistor 740 should be increased so that the gate terminal G of noise suppression transistor 630 is pulled to logic low more quickly, which deactivates noise suppression transistor 630. For a NMOS transistor to have a current sinking strength equal to the current sourcing strength of a PMOS transistor, the W/L ratio of the NMOS transistor must be approximately 0.4 to 0.5 times the W/L ratio of the PMOS transistor. Therefore, to rapidly deactivate noise suppression transistor 630, the W/L ratio of NMOS transistor 750 should be about one to four times the W/L ratio of PMOS transistor 740 and in one embodiment is greater than three times the W/L ratio of PMOS transistor 740. The optimal sizes of PMOS transistor 740 and NMOS transistor 750 depends on the timing constraint on signal line 120.

Figure 8:
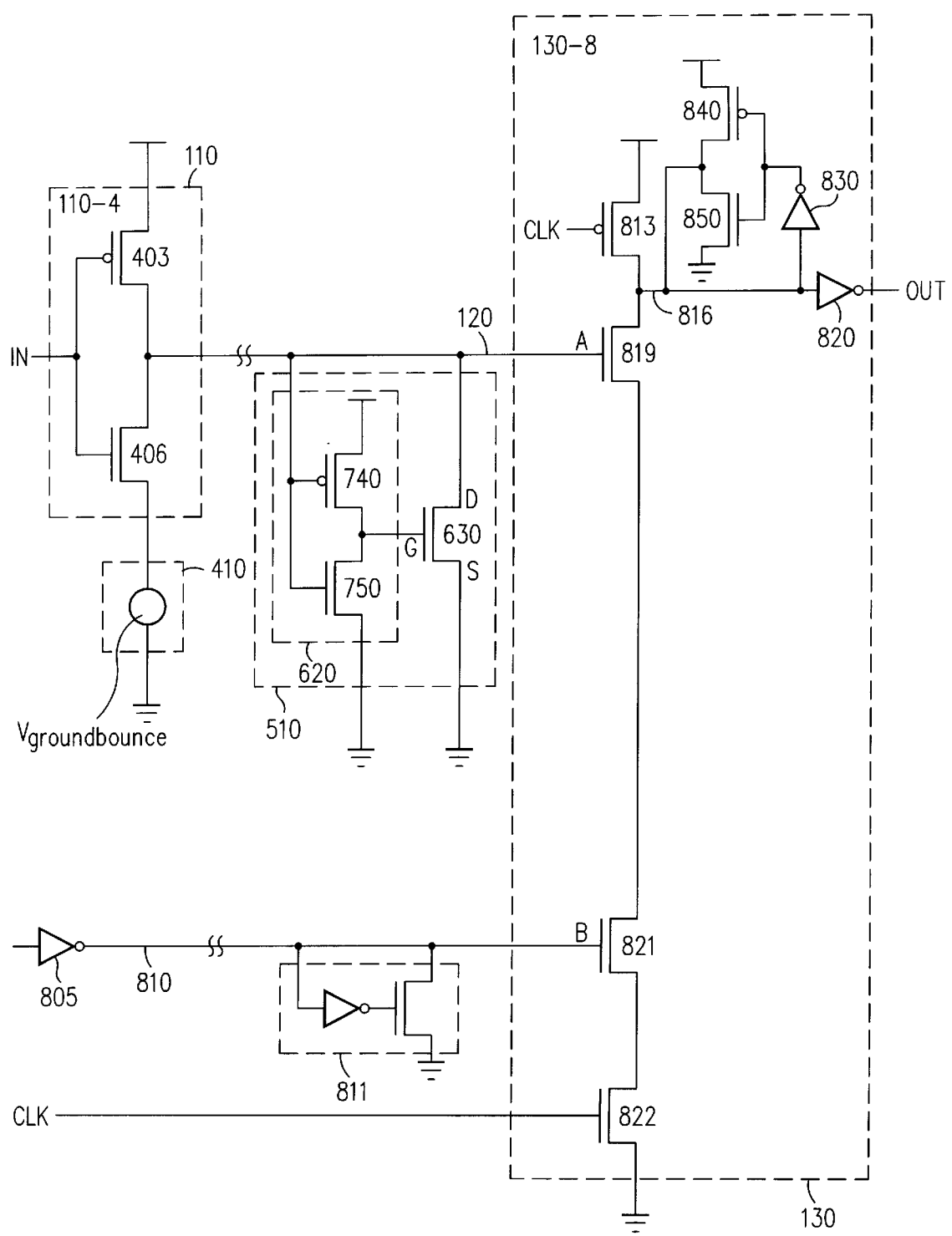
FIG. 8 shows a transistor level circuit of a static inverter coupled to a CMOS domino AND gate by a signal line, which is also coupled to one embodiment of the present invention to suppress noise on the signal line.

FIG. 8 shows noise suppression pull-down circuits 510 used with CMOS domino AND gate 130-8. Since the precharge and feedback parts of CMOS domino AND gate 130-8 are identical to CMOS domino driver 1304 as described above, the description is not repeated. During the evaluation interval, if input signal A on signal line 120 and input signal B on signal line 810 are at logic high, the charge on output node 816 can be discharged to ground through input NMOS transistor 819, input NMOS transistor 821, and clocked NMOS transistor 822, so that output node 816 is at logic low. However, if either input signal A on signal line 120 or input signal B on signal line 810 is at logic low, the charge on output node 816 is not discharged, so that output node 816 remains at logic high. Output inverter 820 provides output signal OUT by inverting the signal on output node 816.

Noise suppression pull-down circuit 510 is coupled to signal line 120 to suppress noise on signal 120 so that input NMOS transistor 819 is not erroneously activated. Similarly noise suppression pull-down circuit 811 is coupled to signal line 810 to suppress noise on signal line 810.

In the various embodiments of this invention, a method and structure has been described that suppresses noise on a signal line without degrading speed or consuming as much area as prior art noise suppression methods. The various embodiments of the structure and method of this invention that are described above are illustrative only of the principles of this invention and are not intended to limit the scope of the invention to the particular embodiments described. In view of this disclosure, those skilled-in-the-art can define other noise suppression pull-down circuits, other logic elements, other wire types, other types of integrated circuits, and use these alternative features to create a method, circuit, or system according to the principles of this invention.

I claim:

1. A circuit comprising:
   a first logic element having an output terminal;
   a second logic element having an input terminal, and a terminal coupled to a first ground voltage level;
   a signal line having a first end coupled to said output terminal of said first logic element, and a second end coupled to said input terminal of said second logic element; and
   a single noise suppression pull-down circuit coupled to said signal line between said output terminal of said first logic element and said input terminal of said second logic element, and said single noise suppression pull-down circuit including a ground terminal coupled to a second ground voltage level wherein said single noise suppression pull-down circuit is located within the vicinity of said second logic element so that said first and second ground voltage levels are approximately a same ground voltage level.

2. The circuit of claim 1, wherein said noise suppression pull-down circuit further comprises:
   an inverter having an inverter input terminal coupled to said signal line, and an inverter output terminal; and
   a first transistor having a first transistor control terminal coupled to said inverter output terminal, a first transistor first power terminal coupled to said signal line, and a first transistor second power terminal coupled to said ground terminal.

3. The circuit of claim 2, wherein:
   said first transistor control terminal is a gate terminal;
   said first transistor first power terminal is a drain terminal; and
   said first transistor second power terminal is a source terminal.

4. The circuit of claim 2, wherein said inverter comprises a PMOS transistor and a NMOS transistor.

5. The circuit of claim 4, wherein said NMOS transistor has a current sinking strength greater than a current sourcing strength of said PMOS transistor.

6. The circuit of claim 4, wherein said NMOS transistor has a NMOS channel width/length ratio greater than a PMOS channel width/length ratio of said PMOS transistor.

7. The circuit of claim 4, wherein said NMOS transistor has a NMOS channel width/length ratio greater than three times a PMOS channel width/length ratio of said PMOS transistor.

8. The circuit of claim 1, wherein said first logic element is a static inverter.

9. The circuit of claim 1, wherein said first logic element and said second logic element are on a single semiconductor die.

10. The circuit of claim 1, wherein said signal line is a wire on a printed circuit board.

11. A circuit comprising:
    a first logic element having an output terminal;
    a second logic element having an input terminal;
    a signal line having a first end coupled to said output terminal of said first logic element, and a second end coupled to said input terminal of said second logic element; and
    a noise suppression pull-down circuit coupled to said signal line, wherein said noise suppression pull-down circuit comprises:
       an inverter having an inverter input terminal coupled to said signal line, and an inverter output terminal; and
       a first transistor having a first transistor control terminal coupled to said inverter output terminal, a first transistor first power terminal coupled to said signal line, and a first transistor second power terminal coupled to ground and wherein
       said first logic element has a PMOS transistor coupled to said signal line, said PMOS transistor having a current sourcing strength;
       said first transistor has a current sinking strength; and
       said current sourcing strength of said PMOS transistor is greater than said current sinking strength of said first transistor.

12. The circuit of claim 11, wherein said first transistor has a channel width/length ratio between about 0.02 and about 0.05 times a PMOS channel width/length ratio of said PMOS transistor.

13. A circuit comprising:

a first logic element having an output terminal;

a second logic element having an input terminal wherein said second logic element is a CMOS domino driver;

a signal line having a first end coupled to said output terminal of said first logic element, and a second end coupled to said input terminal of said second logic element; and a noise suppression pull-down circuit coupled to said signal line.

14. A circuit comprising:

a first logic element having an output terminal;

a second logic element having an input terminal wherein said second logic element is a CMOS domino AND gate;

a signal line having a first end coupled to said output terminal of said first logic element, and a second end coupled to said input terminal of said second logic element; and a noise suppression pull-down circuit coupled to said signal line.

* * * * *